United States Patent [19]

Petropoulos et al.

[11] Patent Number: 5,655,533

[45] Date of Patent: Aug. 12, 1997

[54] ACTIVELY SHIELDED ORTHOGONAL GRADIENT COILS FOR WRIST IMAGING

[75] Inventors: Labros Petropoulos, Cleveland Heights; John L. Patrick, Chagrin Falls; Michael A. Morich, Mentor, all of Ohio

[73] Assignee: Picker International, Inc., Highland Heights, Ohio

[21] Appl. No.: 269,655

[22] Filed: Jun. 30, 1994

[51] Int. Cl.$^6$ .................................................. A61B 5/055
[52] U.S. Cl. ........................ 128/653.5; 324/318; 324/322
[58] Field of Search ........................... 128/653.5; 324/309, 324/318, 319, 320, 322

[56] References Cited

U.S. PATENT DOCUMENTS

| | | | |
|---|---|---|---|
| 4,617,516 | 10/1986 | Schenck | 324/318 |
| 4,646,024 | 2/1987 | Schenck et al. | 324/318 |
| 4,697,147 | 9/1987 | Moran et al. | 324/309 |
| 4,737,716 | 4/1988 | Roemer et al. | 324/319 |
| 4,794,338 | 12/1988 | Roemer et al. | 324/318 |
| 5,036,282 | 7/1991 | Morich et al. | 324/318 |
| 5,057,777 | 10/1991 | Kurczewski | 324/318 |
| 5,177,442 | 1/1993 | Roemer | 324/322 |
| 5,235,279 | 8/1993 | Kaufman et al. | 324/309 |
| 5,296,810 | 3/1994 | Morich | 324/319 |
| 5,309,107 | 5/1994 | Pausch | 324/318 |
| 5,323,113 | 6/1994 | Cory et al. | 324/318 |
| 5,343,148 | 8/1994 | Westphal et al. | 324/309 |
| 5,372,137 | 12/1994 | Wong et al. | 128/653.5 |

FOREIGN PATENT DOCUMENTS

| | | |
|---|---|---|
| 580324A3 | 1/1994 | European Pat. Off. . |
| 638814A1 | 2/1995 | European Pat. Off. . |
| 2262808 | 6/1993 | United Kingdom . |

OTHER PUBLICATIONS

"Insertable Asymmetric Cylindrical Gradient Coils", Petropoulos, et al. SMRM Book of Abstracts, V. 2, 11th Annual Scientific Meeting, Aug. 8–14, 1992, p. 4032.
"Actively Shielded Orthogonal Gradient Coils For Wrist Imaging", Petropoulos, et al., Proceedings of SMRM, V. 3, 12th Annual Scientific Meeting, Aug. 14–20, 1993, p. 1309.
"High–Resolution, Short Echo Time MR Imaging of the Fingers and Wrist with a Local Gradient Coil", Wong, et al., Radiology 1991; 181:393–397.

*Primary Examiner*—Brian L. Casler
*Attorney, Agent, or Firm*—Fay, Sharpe, Beall, Fagan, Minnich & McKee

[57] ABSTRACT

A magnetic resonance imaging apparatus includes main field coils (10) for generating a temporally uniform magnetic field longitudinally through a central bore (12). A whole body gradient magnetic field coil (30) and radio frequency coil (36) are disposed around the bore. An insertable coil assembly (40) includes an insertable gradient coil, a radio frequency coil (74) and a radio frequency shield (76). The insertable gradient coil includes a pair (62, 64) of x-gradient windings (FIGS. 3 and 4), a pair (66, 68) of y-gradient windings (FIGS. 5 and 6), and a pair (70, 72) of z-gradient windings (FIGS. 7 and 8), which are wrapped around inner and outer surfaces of a dielectric former (60). The x, y, and z insertable gradient coil pairs are configured such that they generate uniform magnetic field gradients within the insertable coil assembly when its central axis is positioned transverse to the direction of the temporally uniform magnetic field generated by the main field coils. The insertable coil assembly is ideally suited for imaging a patient's wrist when the patient rests the insertable coil assembly with its wrist therein on the patient's thorax region transverse to the central bore of the magnetic resonance imaging apparatus.

17 Claims, 8 Drawing Sheets

ACTIVELY SHIELDED ORTHOGONAL GRADIENT COILS FOR WRIST IMAGING

BACKGROUND OF THE INVENTION

The present invention relates to the magnetic resonance imaging art. It finds particular application in conjunction with insertable gradient coils for imaging the wrist and will be described with particular reference thereto. However, it is to be appreciated that the invention will also find application in conjunction with other types of insertable magnetic field gradient coils.

Magnetic resonance imagers commonly include a large diameter, whole body gradient coil which surrounds a patient receiving bore. Main field magnets, either superconducting or resistive, and radio frequency transmission/reception coils also surround the bore. Although the whole body gradient coils produce excellent linear magnetic field gradients, they have several drawbacks. With large diameter gradient coils, the slew rate is sufficiently slow that it is a limiting factor on the rate at which gradient magnetic fields can be induced and changed. Large diameter whole body gradient coils have relatively low gradient field per unit Ampere for given inductance which limits their use for some of the highest speed magnetic resonance imaging techniques. The energy stored in gradient coils is generally proportional to more than the fifth power of the radius. Hence, large diameter, whole body coils require much larger amounts of energy. Further, superconducting main magnets have cold shields disposed around the bore. The larger the diameter of the gradient coil, the closer it is to the cold shields and, hence, the more apt it is to produce eddy currents. More shielding is needed to prevent the whole body gradient coils from inducing eddy currents in the cold shields than would be necessary for smaller diameter coils.

Due to these and other limitations in whole body coils, numerous insertable coils have been developed which are small enough to fit within the bore with the patient. Typically, the insertable coils are customized to a specific region of the body, such as a wrist coil. Traditionally, wrist coils have been a cylinder sized to accommodate the human hand, wrist, and forearm, e.g. 14–17 cm in diameter.

One of the difficulties with such insertable cylindrical gradient coils is that they need to be positioned at or near the isocenter of the magnet with their central axis aligned with the primary magnetic field.

In conventional whole body magnetic resonance imagers, the main magnetic field aligns axially with a central bore of a superconducting magnet assembly. The central bore is typically about 60 cm in diameter, and about 2 m in length. Part of the bore is lost to the patient supporting couch and other associated equipment. Moreover, it is advantageous for the patient to be generally centered in the bore. If the patient is pressed against the bore, the patient may be so close to the surrounding gradient and RF coils that artifacts are induced in the resultant image. With these constraints, it is very difficult to position a patient comfortably in the bore with his/her wrist at the isocenter and with the central axes of the wrist coil and the main magnet bore aligned.

Although the patient's forearm can physically be positioned along the longitudinal centerline of the chest, such a position places the wrist over the heart. Placing an insertable coil so close to the heart is generally considered a safety risk. Accordingly, less comfortable, but safer, positioning of the patient is commonly selected. Commonly, positioning the patient face down on the patient couch with the arm in question extended overhead is considered the most comfortable patient position.

Greater patient comfort might also be attained by positioning the wrist toward one end of the bore. However, because the homogeneity of the main magnetic field is greatest near the isocenter and is significantly reduced towards the ends, positioning the patient's wrist toward the end of the bore results in reduced image quality and enhanced $T_2^*$ and phase effects.

Some of the prior art insertable coils which are suitable for the wrist are non-shielded coils. Because the insertable wrist coils are placed close to the main magnet shield, eddy current effects are present in non-shielded coils. Such eddy currents significantly increase the rise times and worsen the slew rates of the insertable gradient coil. Moreover, these deleterious effects occur asymmetrically and are non-linear over the imaging region.

In accordance with the present invention, a new and improved insertable gradient coil is provided which overcomes the above-referenced problems and others.

SUMMARY OF THE INVENTION

In accordance with the present invention, a tubular, insertable gradient coil is provided whose central axis is ideally positioned orthogonal to a central axis of a primary magnetic field.

In accordance with a more limited aspect of the present invention, the insertable gradient coil is shielded and includes x, y, and z-gradient coils for generating linear magnetic field gradients along each of three orthogonal axes when the axis of the insertable gradient coil is disposed perpendicular to the main magnetic field.

One advantage of the present invention is that it improves image quality.

Another advantage of the present invention is that it improves patient comfort.

Another advantage of the present invention resides in the elimination of eddy current effects.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
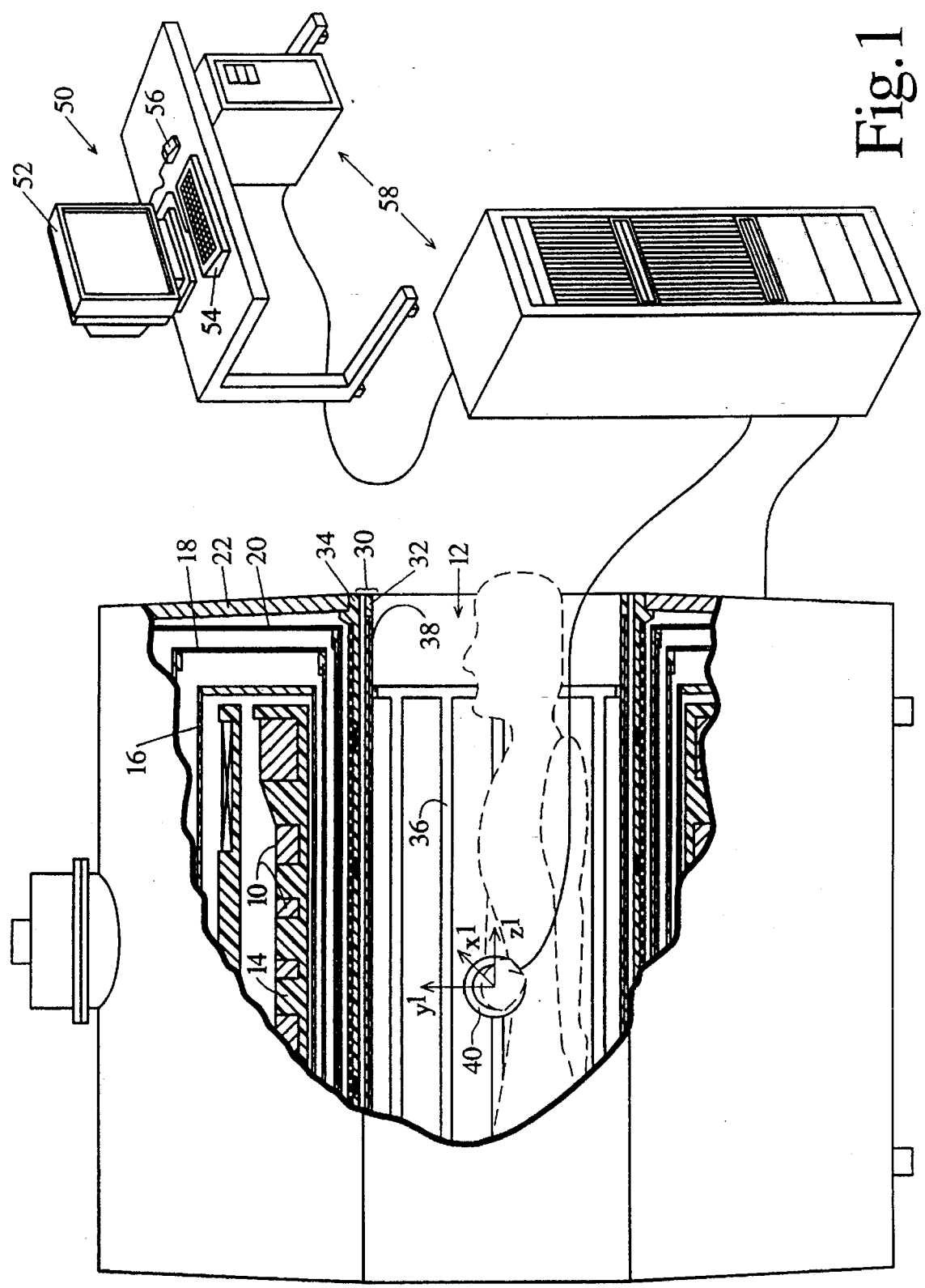
FIG. 1 is a diagrammatic illustration of a magnetic resonance imaging system including an insertable wrist coil in accordance with the present invention.

With reference to FIG. 1, a plurality of primary magnet coils 10 generate a temporally constant magnetic field along a longitudinal axis of a central bore 12. The coordinate system of the primary magnets includes a z' axis extending longitudinally along the bore toward the patient's head, a vertical y' axis, and an x' axis extending into the paper in FIG. 1. In a preferred superconducting embodiment, the primary magnet coils are supported by a former 14 and received in a toroidal helium vessel or can 16. The vessel is filled with liquid helium to maintain the primary magnet coils at superconducting temperatures. The can is surrounded by a series of cold shields 18, 20 which are supported in a vacuum dewar 22.

A whole body gradient coil assembly 30 includes x+, y+, and z'-coils mounted along the bore 12. Preferably, the whole body gradient coil assembly is a self-shielded gradient coil assembly that includes primary x+, y+, and z'-coil assemblies 32 potted in a dielectric former and a secondary gradient coil assembly 34 that is supported on a bore defining cylinder of the vacuum dewar 22. A whole body RF coil 36 is mounted inside the gradient coil assembly 30. A whole body RF shield 38, e.g. copper mesh, is mounted between RF coil 36 and the gradient coil assembly 34.

An insertable wrist coil 40 is selectively supported near the isocenter, conventionally the geometric center, of the bore 12. The wrist coil has a coordinate system with a z-axis extending along its bore, a vertical y axis, and an x axis extending into the paper in FIG. 2. Note that in the wrist coil orientation of FIG. 1, the wrist coil x axis is parallel to the primary magnet z' axis; the wrist coil y axis is parallel to the primary magnet y' axis; and the wrist coil z axis is parallel to the primary magnet x' axis.

An operator interface and control station 50 includes a human-readable display such as a video monitor 52 and an operator input means including a keyboard 54 and a mouse 56. A computer control and reconstruction module 58 includes computer hardware and software for controlling the radio frequency coils 36 and 46 and the gradient coils 30 and 44 to implement any of a multiplicity of conventional magnetic resonance imaging sequences, including echo-planar and echo-volume imaging sequences. Echo-planar imaging and echo-volume imaging sequences are characterized by short repetition rates and low flip angles. The processor 58 also includes a digital transmitter for providing RF excitation and resonance manipulation signals to the RF coils and a digital receiver for receiving and demodulating magnetic resonance signals. An array processor and associated software reconstruct the received magnetic resonance signals into an image representation which is stored in computer memory or on disk. A video processor selectively extracts portions of the stored reconstructed image representation and formats the data for display by the video monitor 52.

Figure 2:
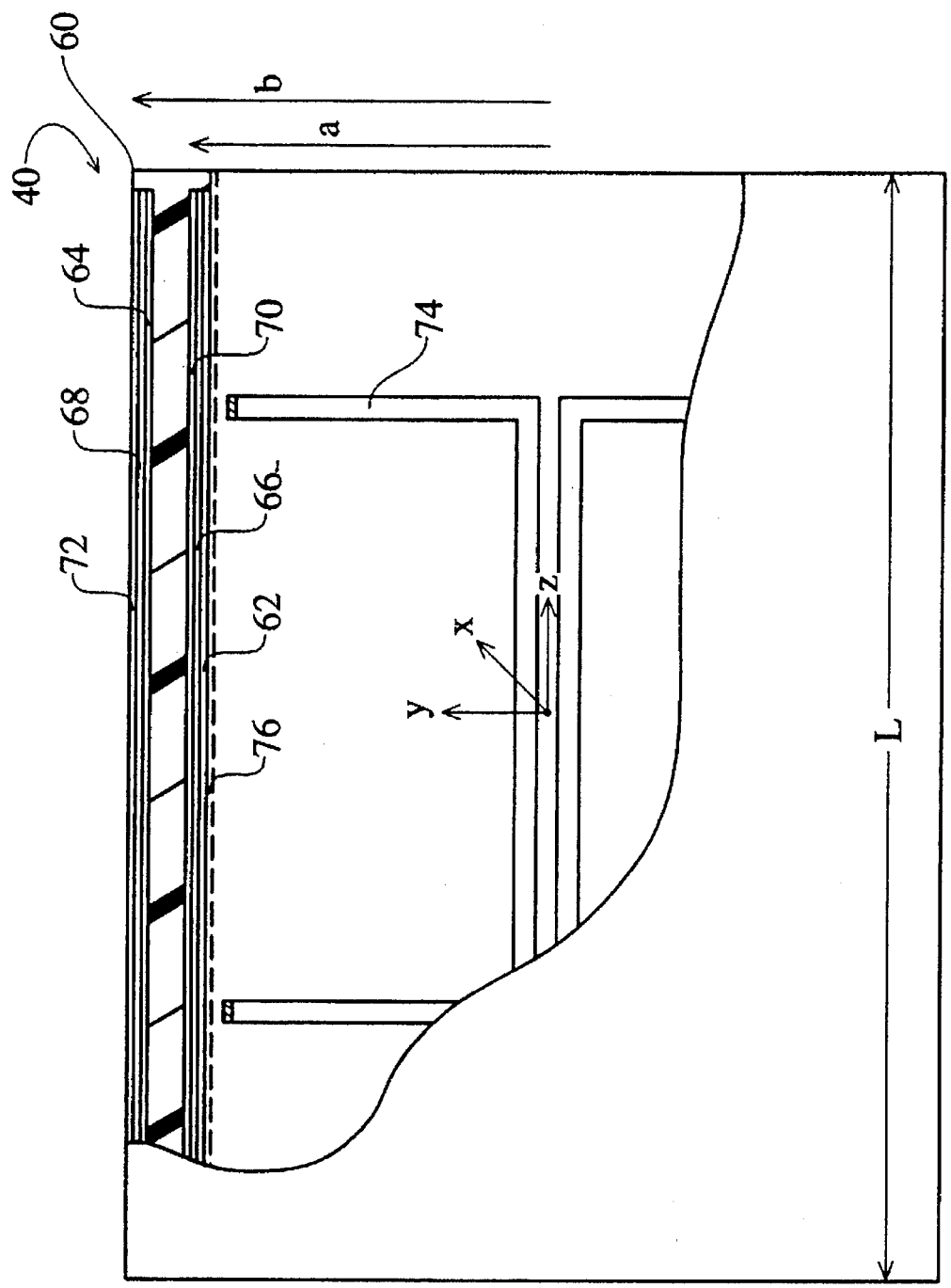
FIG. 2 is a side view in partial section of the wrist gradient coil of FIG. 1.

With reference to FIG. 2, the active gradient insertable wrist coil 40 includes an insertable gradient coil assembly.

A cylindrical, dielectric former 60 supports an inner x-gradient coil 62 of radius a and an outer x-gradient coil 64 of radius b. The inner gradient coil is of length L. The former further supports an inner y-gradient coil 66 of radius a and length L and an outer y-gradient coil of radius b. The former further supports an inner z-gradient coil 70 of radius a and length L and an outer z-gradient coil 72 of radius b. The inner and outer x, y, and z-gradient coils may be encased in epoxy resin to become unitary with the former, but are preferably built on two or more discrete formers to provide cooling passages between the inner and outer gradient coils. An insertable RF coil 74 is mounted inside the dielectric former. An RF shield 76 is mounted between the insertable RF and gradient coils. The RF coil is preferably solenoidal in geometry to produce a $B_1$ field orthogonal to $B_0$, where the axis of the solenoid is aligned with the wrist gradient cylindrical axis. A Helmholtz pair is preferred. A vertical mode birdcage or saddle coil can be used as an alternative to, or in conjunction with the Helmholtz pair to give a quadrature RF configuration.

The set of wrist gradient coils are designed such that an x'-component of the primary magnetic field varies linearly along the x, y, and z-direction of a reference frame with respect to the wrist gradient coil set. Due to the position of the coil set inside the magnetic finite size and due to the proximity of fringe fields to the patient's chest cavity, actively shielded gradient coils are preferred. As described below, the x, y, and z-gradient coils are preferably distributed or fingerprint coils, although bunched windings which approximate the below described current carrying characteristics may also be utilized.

This type of gradient coil uses x, y, and z-gradient coils which generate a gradient field that is odd-symmetric in the x-direction around the geometric origin of the gradient coil set while being even-symmetric in the y and z-directions. Due to the odd-symmetry for the current density, its Fourier expansion for this type of coil reduces to a sine series. Furthermore, the current densities for both the inner and outer coils are preferably constrained to lie on the surface of the two cylinders and are constructed as a linear superposition of two components, one along the axial direction of the gradient coil reference frame, and the other along the azimuthal direction of the gradient coil reference frame. Employing Fourier series expansion for both current densities and expressing the x-component of the magnetic field in terms of its radial and azimuthal components in cylindrical coordinates, the function E can be defined in terms of the stored magnetic energy W and the x-component of the magnetic field $B_x$:

$$E(j_n^a) = W - \sum_{j=1}^{N} \lambda_j (B_x(\vec{r_j}) - B_x sc(\vec{r_j})) \qquad (1)$$

where $\lambda_j$ are the Lagrange multipliers and $B_x sc$ represent the constraint values of the x component of the magnetic field at N specified points. Because E is a quadratic function of the current, minimizing E with respect to current density coefficients $j_n^a$ produces a matrix equation in which $j_n^a$ satisfies:

$$\sum_{n'=1}^{\infty} j_{n'}^a \left\{ -\frac{aL\pi}{2} \int_{-\infty}^{\infty} dk I_2'(ka) K_2'(ka) \left(1 - \frac{I_2'(ka)K_2'(kb)}{I_2'(kb)K_2'(ka)}\right) \psi_{n'}(k)\psi_n(k) \right\} = \qquad (2)$$

$$\sum_{j=1}^{N} \lambda_j \int_{-\infty}^{\infty} dk k \cos k z_j K_2'(ka) \left( 1 - \frac{I_2'(ka)K_2'(kb)}{I_2'(kb)K_2'(ka)} \right) \psi_n(k) \left[ \cos 2\theta_j \cos \theta_j I_1(k\rho_j) - \cos 3\theta_j \frac{2}{k\rho_j} I_2(k\rho_j) \right],$$

where the evaluation of the LaGrange multipliers can be done via the constraint equation. Inverting the previous matrix equation, a solution for $j_n{}^a$ is obtained, hence the current densities. Replacing this expression into the stored energy and magnetic field formulas, a final expression for the stored magnetic energy and the magnetic field in terms of the constraint points and the geometry of the system is acquired. In the preferred embodiment, the stream function technique is used to discretize the current patterns for the coils, i.e. divide the continuous current function defined by the equations into discrete winding patterns.

In the preferred embodiment of the x wrist gradient coil, the radius a of the inner coil is 7 cm and the radius b of the outer coil is 8.5 cm and the total inner coil length L is 20 cm. The sizes are chosen in order to fit in the region between the thorax and a plastic cover of the magnetic resonance imager.

Figure 3:
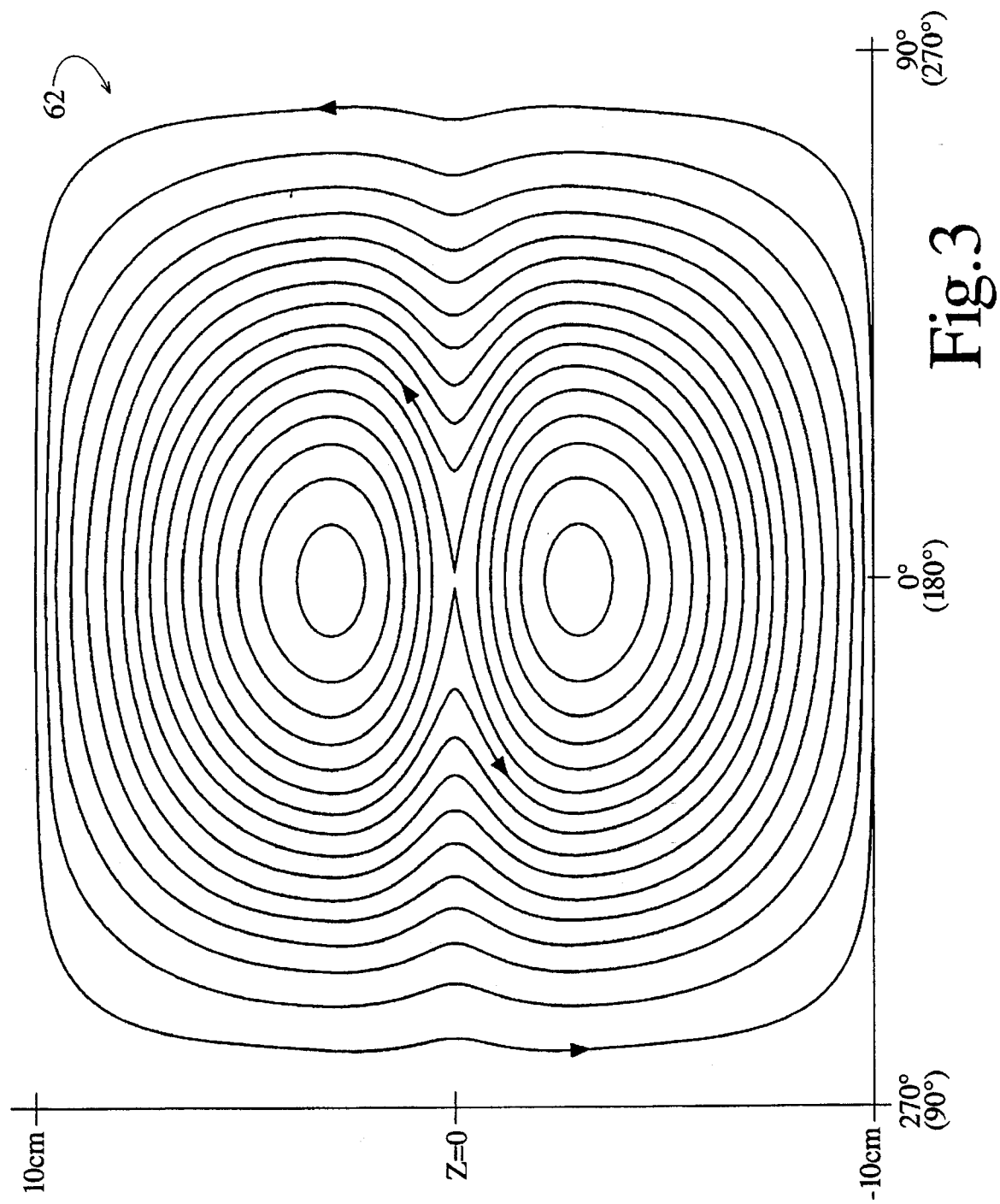
FIG. 3 is a diagrammatic illustration of the windings of an inner wrist x-gradient coil in accordance with the present invention.
Figure 4:
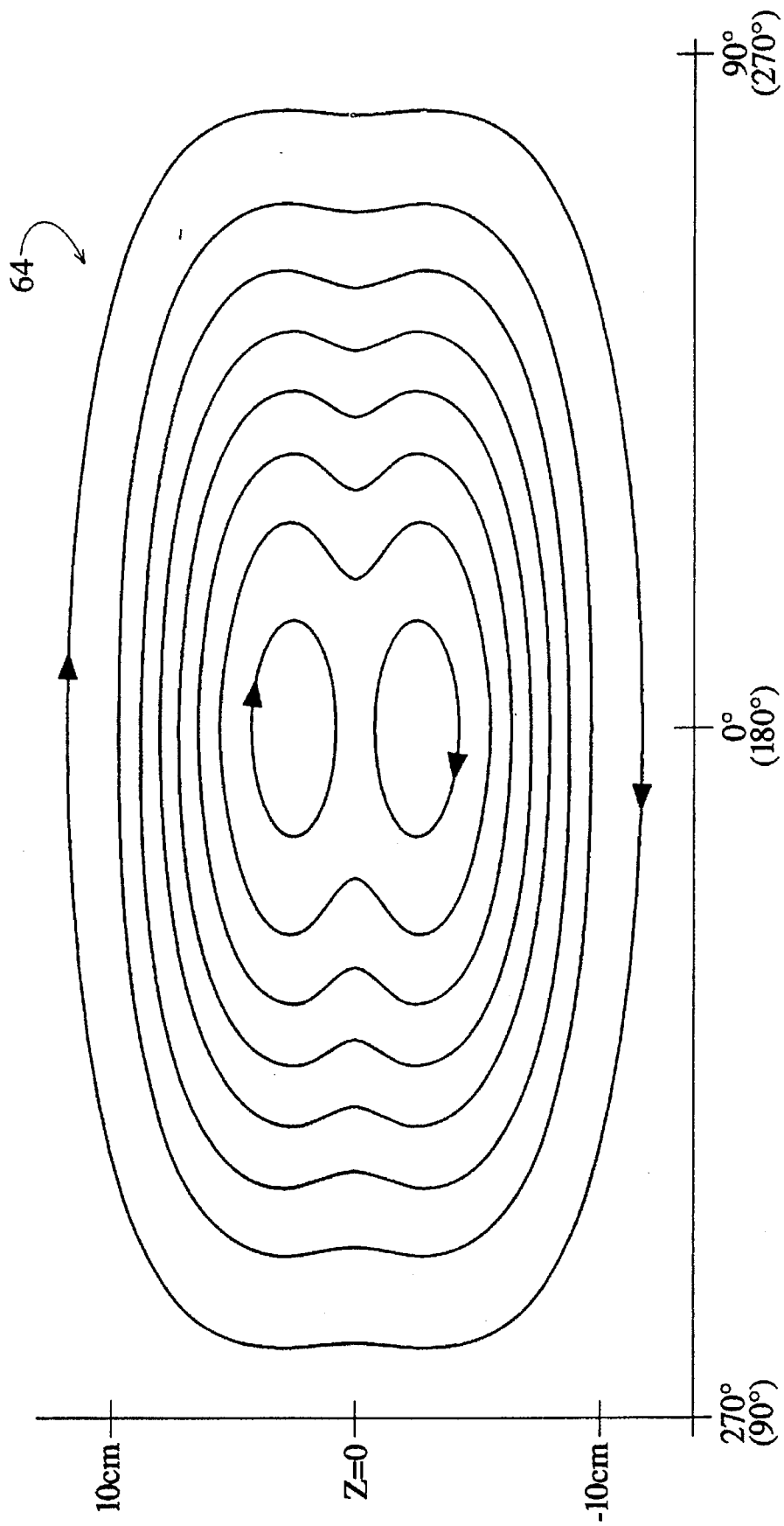
FIG. 4 is a diagrammatic illustration of an outer wrist x-gradient shield coil in accordance with the present invention.

The discrete winding patterns for both the inner or primary coil and outer or secondary coil which correspond to a 40 mT/m gradient strength with a 5% on-axis linearity and a 5% off-axis uniformity for a 10 cm in diameter spherical volume are illustrated in FIGS. 3 and 4. The primary x-gradient coil 62 has a generally figure-8 configuration. The x-gradient shield coil 64 has counter rotating current loops centrally with outer loops.

Figure 5:
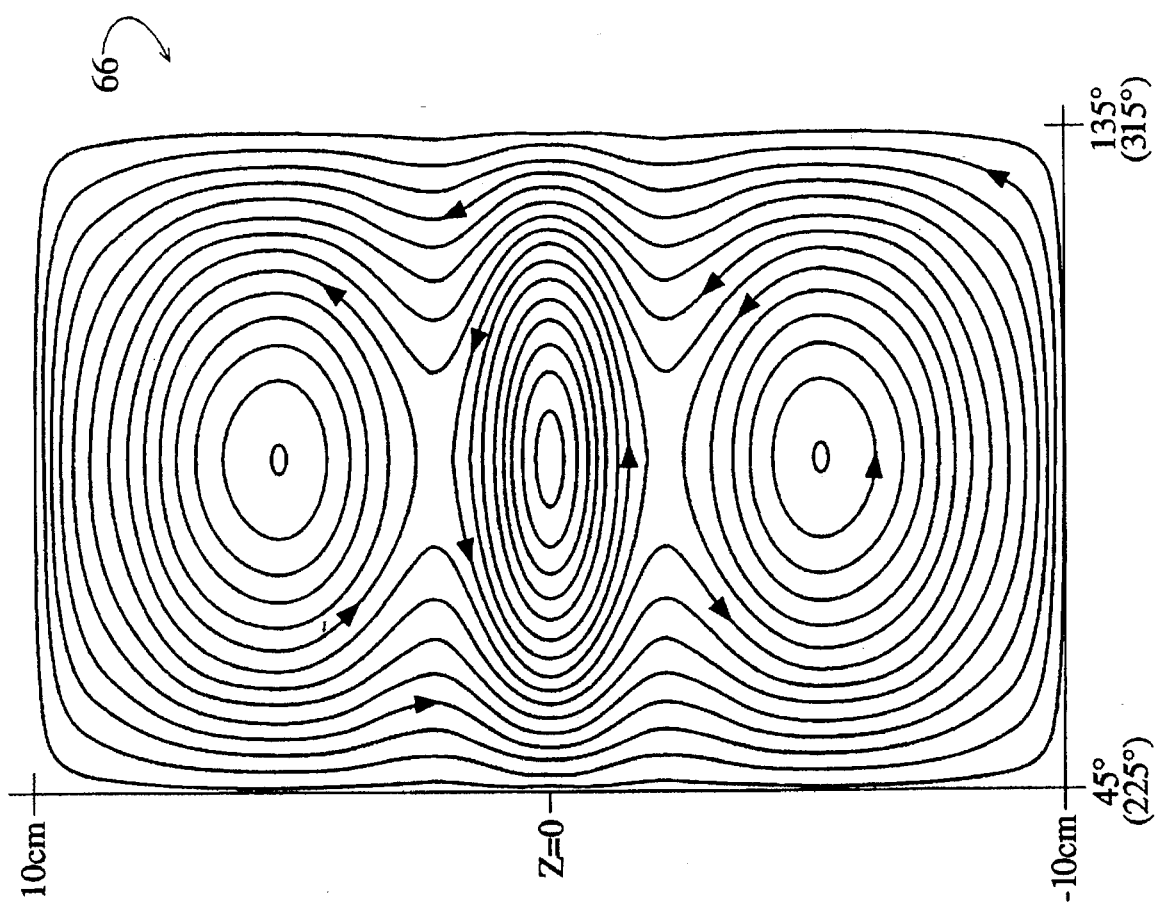
FIG. 5 is a diagrammatic illustration of an inner wrist y-gradient coil in accordance with the present invention.
Figure 6:
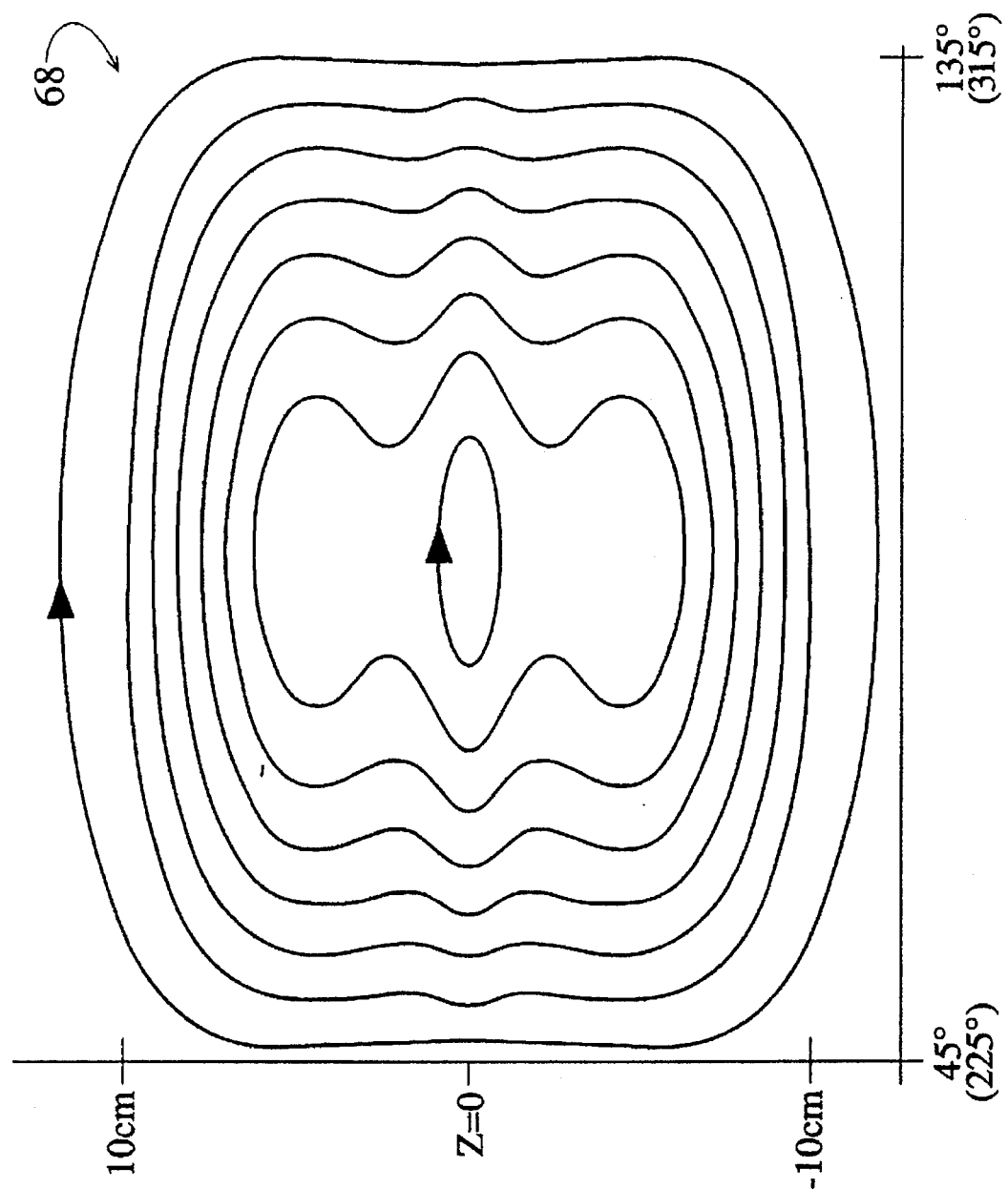
FIG. 6 is a diagrammatic illustration of an outer wrist y-gradient shield coil in accordance with the present invention.

With reference to FIGS. 5 and 6, the self-shielded y wrist gradient coil is designed to generate a linearly varying x component of the magnetic field along the y-direction of a coordinate system which is associated with the gradient coil. In parallel fashion with the above-described x-gradient coil determination, the creation of the x component of the magnetic field again uses the superposition of the radial and azimuthal components of the magnetic field with respect to the cylindrical coordinate system. The current density is again expanded in terms of Fourier coefficients to accommodate the finite coil length.

The expression of the current density for the inner and outer y-gradient coils reflects the symmetry requirements that exist for the y-gradient. For a right-hand cylindrical coordinate system, the current density satisfies the following requirements. First, the current density is symmetric about the origin of the coil and along the z-direction. Second, the z-component of the current density is symmetric about $\phi=0$ and $\phi=\pi$. Third, the z-component of the current density is symmetric about $\phi=\pi/2$ and $\phi=3\pi/2$.

With the minimization technique described in conjunction with the x-gradient coil, the Fourier components of the current density $j_n{}^a$ become:

$$\sum_{n'=1}^{\infty} j_{n'}^a \left\{ -\frac{aL\pi}{2} \int_{-\infty}^{\infty} dk I_2'(ka) K_2'(ka) \left( 1 - \frac{I_2'(ka)K_2'(kb)}{I_2'(kb)K_2'(ka)} \right) \psi_{n'}(k)\psi_n(k) \right\} = \tag{3}$$

$$\sum_{j=1}^{N} \lambda_j \int_{-\infty}^{\infty} dk k \cos k z_j K_2'(ka) \left( 1 - \frac{I_2'(ka)K_2'(kb)}{I_2'(kb)K_2'(ka)} \right) \psi_n(k) \left[ \sin 2\theta_j \cos \theta_j I_1(k\rho_j) - \sin \theta_j \frac{2}{k\rho_j} I_2(k\rho_j) \right].$$

Preferably, the radius a of the inner y wrist gradient coil is 7 cm and the radius b of the outer wrist gradient coil is 8.5 cm. The length L of the inner y wrist gradient coil is 20 cm. For a 40 mT/m gradient strength with 2.5% on-axis linearity and 2.5% off-axis uniformity over a 10 cm in diameter spherical volume and the above-constraints, the discrete current patterns are illustrated in FIGS. 5 and 6. The primary y-gradient coils 66 include a plurality of inner loops along a common axis. The y-gradient shield coil 68 includes a set of loop coils that are contoured near the center.

Figure 7:
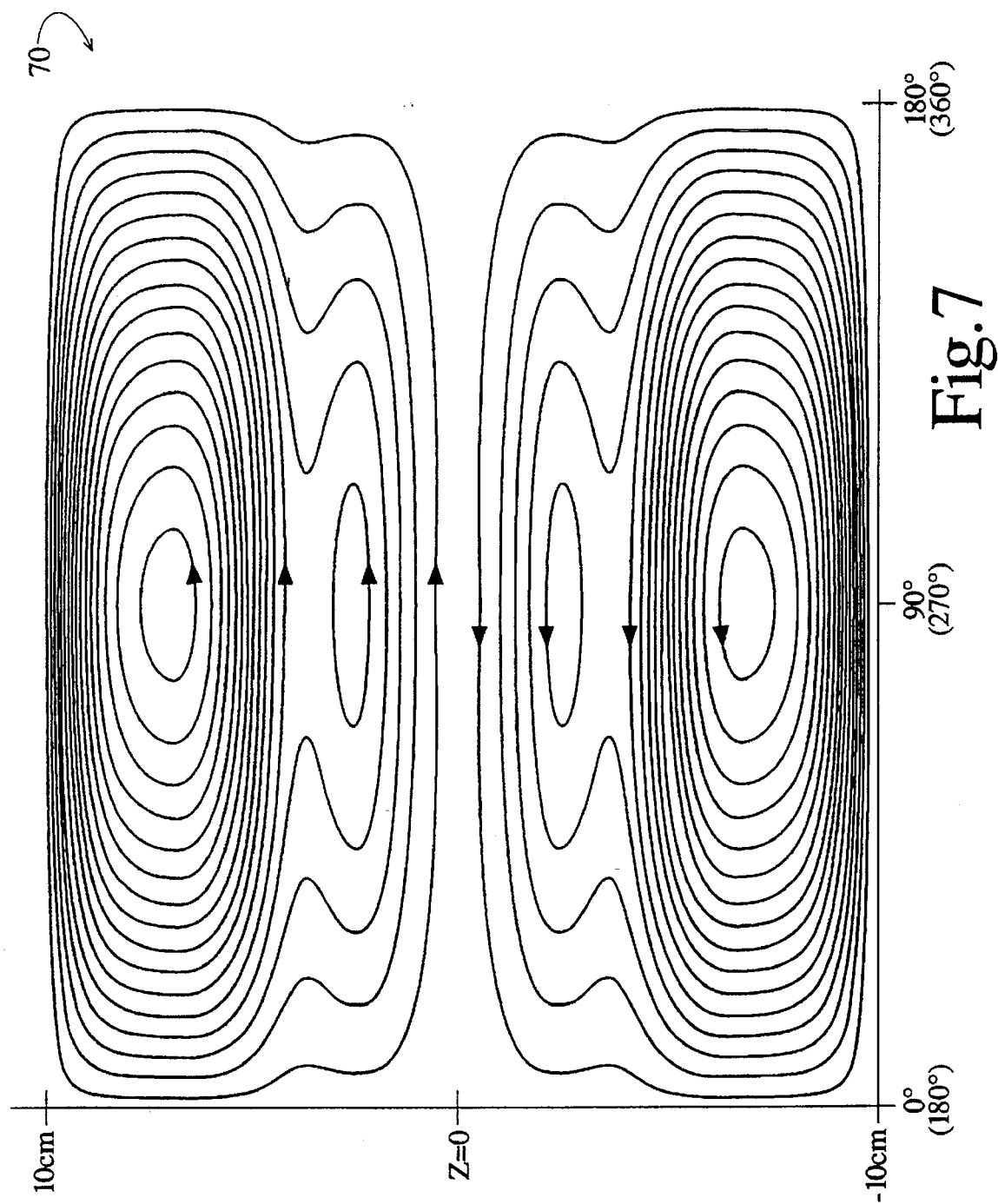
FIG. 7 is a diagrammatic illustration of an inner wrist z-gradient coil in accordance with the present invention.
Figure 8:
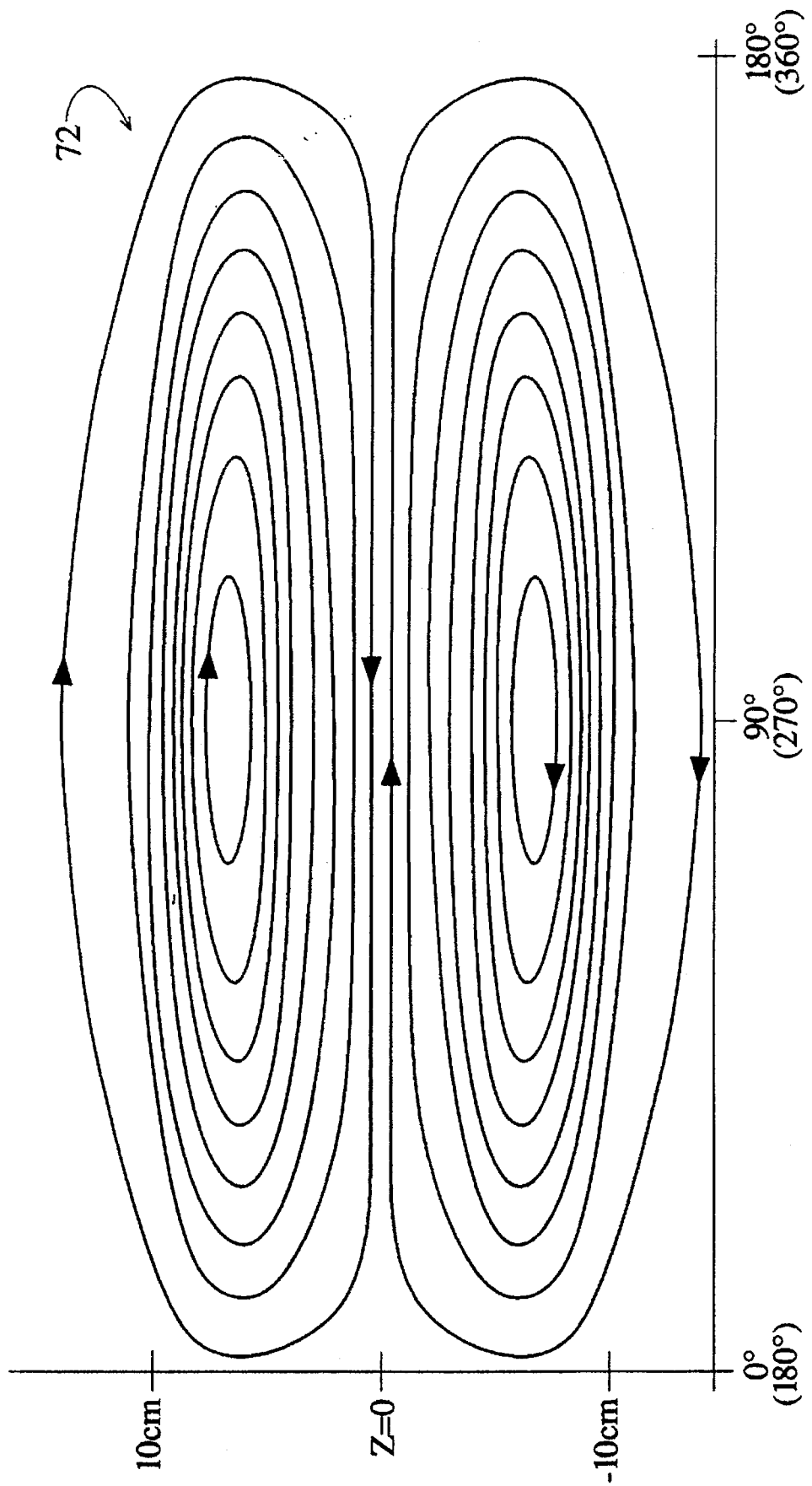
FIG. 8 is a diagrammatic illustration of a wrist z-gradient shield coil in accordance with the present invention.

With reference to FIGS. 7 and 8, the inner and outer z-gradient coils generate a linearly varying x component of the magnetic field along the z direction. The z component of the current density is odd-symmetric around the z direction. Further, the z component of the current density is symmetric around the x and y directions of the cylinder and about its geometric center.

Using the minimization techniques described above, the Fourier expression for the current density $j_n{}^a$ is:

$$\sum_{n'=1}^{\infty} j_{n'}^a \left\{ -\frac{aL\pi}{2} \int_{-\infty}^{\infty} dk I_1'(ka) K_1'(ka) \left( 1 - \frac{I_1'(ka)K_1'(kb)}{I_1'(kb)K_1'(ka)} \right) \psi_{n'}(k)\psi_n(k) \right\} = \tag{4}$$

$$\sum_{j=1}^{N} \lambda_j \int_{-\infty}^{\infty} dk k \sin k z_j K_1'(ka) \left( 1 - \frac{I_1'(ka)K_1'(kb)}{I_1'(kb)K_1'(ka)} \right) \psi_n(k) [\cos^2 \theta_j(k\rho_j) I_0(k\rho_j) - \cos 2\theta_j I_1(k\rho_j)].$$

This continuous current density is divided into discrete currents for the inner and outer z-gradient coils as described above for the x and y-gradient coils.

In the preferred embodiment, the radius of the inner coil is 7 cm and its length is 20 cm. The radius of the outer z-gradient coil is 8.5 cm. For a 44 mT/m gradient strength with a 2.5% on-axis linearity and a 2.5% off-axis uniformity, the discrete winding patterns of the z-gradient coil are illustrated in FIGS. 7 and 8. The primary z-gradient coils 70 include counter rotating current loops with linearity improving central loops. The z-gradient shield coils 72 include counter rotating current loops.

Various alternate embodiments of course present themselves. For example, the insertable wrist gradient coil can be fabricated in a non-shielded version. Rather than working from the x'-gradient field of the main magnetic field coil, the wrist gradient coil can be fashioned to operate on the y' component, a combination of x' and y' components, or a combination of x+, y+, and z' components. In this manner, the wrist gradient coil can be configured to be mounted obliquely within the bore. Although the invention is illustrated in conjunction with a series of annular superconducting magnets in which the main magnetic field is generated through the bore, these same design techniques are also suitable for use with C-coils for generating the main magnetic field. As another alternate embodiment, the wrist gradient coil may be a biplanar coil.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging apparatus which includes a means for generating a temporally uniform magnetic field along a primary magnetic field axis through an examination region, a means for transmitting radio frequency signals into the examination region for inducing and manipulating magnetic resonance of dipoles disposed in the examination region, and a means for receiving magnetic resonance signals emanating from the selected portion of the subject and reconstructing the received magnetic resonance signals into an image representation, the improvement comprising:

a dielectric cylinder having a tubular side wall that extends parallel to and surrounds a longitudinal central axis of the dielectric cylinder;

a gradient coil assembly mounted on and extending around the dielectric cylinder, the dielectric cylinder and the gradient coil assembly being removably disposed in the examination region with said longitudinal central axis of the dielectric cylinder oriented transverse to the primary magnetic field axis.

2. A magnetic resonance imaging apparatus comprising:

a main magnetic field means for generating a temporally constant magnetic field along a magnetic field axis through a central bore thereof;

a radio frequency coil means for at least transmitting radio frequency signals into the central bore for inducing and manipulating magnetic resonance of selected dipoles in the bore;

a means for receiving magnetic resonance signals emanating from the selected dipoles in the bore and reconstructing an image representation from the magnetic resonance signals; and, a magnetic field gradient coil assembly dimensioned to receive a portion of a subject along a subject axis thereof, the magnetic field gradient coil assembly being removably disposed within the bore with the subject axis out of alignment with the magnetic field axis, the magnetic field gradient coil assembly including gradient coil means for generating magnetic field gradients along three orthogonal axes across the portion of the subject received in the magnetic field gradient coil assembly.

3. The magnetic resonance imaging apparatus as set forth in claim 2 wherein the main magnetic field has a first component parallel to the bore and at least a second component in a direction transverse to the bore and wherein the magnetic field gradient coil assembly includes a first gradient coil means for generating a gradient field along the second component, which generated gradient field is anti-symmetric in the second component direction and symmetric parallel to the bore.

4. The magnetic resonance imaging apparatus as set forth in claim 3 wherein the magnetic field gradient coil assembly further includes a second gradient coil means for generating a magnetic field gradient along a direction orthogonal to the first component and the second component direction.

5. The magnetic resonance imaging apparatus as set forth in claim 4 wherein the magnetic field gradient coil assembly includes a third gradient coil means which carries a current density that is odd-symmetric around the first component and symmetric around the second component direction.

6. The magnetic resonance imaging apparatus as set forth in claim 2 wherein the main magnetic field has a first component parallel to the bore and at least a second component transverse to the bore and wherein the magnetic field gradient coil assembly includes a first gradient coil pair means for interacting cooperatively to create a first gradient field within the gradient coil assembly which is even-symmetric in a direction parallel to the second component and symmetric in a direction parallel to the bore.

7. The magnetic resonance imaging apparatus as set forth in claim 6 wherein the magnetic field gradient coil assembly further includes a second gradient coil pair means for interacting cooperatively to generate a second gradient field with the gradient coil assembly along a direction orthogonal to the bore and the second component.

8. The magnetic resonance imaging apparatus as set forth in claim 7 wherein the magnetic field gradient coil assembly includes a third gradient coil pair means for interacting cooperatively to carry a current density that is odd-symmetric around a direction parallel to the bore and symmetric around a direction parallel to the second component.

9. A magnetic resonance imager apparatus comprising:

a main field magnet which generates a temporally constant magnetic field along a magnetic field axis through a central bore thereof;

a radio frequency coil connected with a radio frequency transmitter and positioned to transmit radio frequency signals from the transmitter into the central bore;

a receiver connected to the radio frequency coil to receive magnetic resonance signals emanating from the selected dipoles in the bore;

a reconstruction processor which reconstruct an image representation from the magnetic resonance signals; and, a magnetic field gradient coil assembly dimensioned to receive a portion of a subject along a subject axis thereof, the magnetic field gradient coil assembly being removably disposed in the bore with the subject axis orthogonal to the magnetic field axis, the magnetic field gradient coil assembly including gradient coils that convert received current pulses into magnetic field gradients along three orthogonal axes across the portion of the subject received in the magnetic field gradient coil assembly.

10. A magnetic resonance imaging apparatus comprising:

a main field magnet having a central bore through which a temporally constant magnetic field extends along a magnetic field axis;

a radio frequency coil disposed adjacent the central bore;

an image processor connected with the radio frequency coil;

a magnetic field gradient coil assembly dimensioned to receive a portion of a subject along a subject axis thereof, the magnetic field gradient coil assembly being removably disposed within the central bore with the subject axis out of alignment with the magnetic field axis, the magnetic field gradient coil assembly includes:

a cylindrical dielectric former;

a pair of z-gradient coils of different radii from each other supported by the dielectric former, the pair of z-gradient coils being positioned such that received current pulses cause magnetic field gradients within an internal bore of the dielectric former along a z-axis;

a pair of y-gradient coils of different radii from each other supported by the dielectric former, the pair of y-gradient coils being positioned such that received current pulses cause magnetic field gradients within the internal bore of the dielectric former along a y-axis, where the z and y axes are orthogonal to each other;

a pair of x-gradient coils of different radii from each other supported by the dielectric former, the pair of x-gradient coils being positioned such that received current pulses cause magnetic field gradients within the internal bore of the dielectric former along an x-axis, where the x-axis is orthogonal to the y and z-axes.

11. The magnetic resonance imaging apparatus as set forth in claim 10 wherein the cylindrical dielectric former is disposed in the main magnetic field with the dielectric former internal bore perpendicular to the magnetic field axis.

12. The magnetic resonance imaging apparatus as set forth in claim 10 wherein the x-gradient coil pair includes two individual x-gradient coils which are mounted on the dielectric former on opposite sides thereof, the individual x-gradient coils each being generally figure-8 shaped.

13. The magnetic resonance imaging apparatus as set forth in claim 12 wherein the y-gradient coil pair includes two individual y-gradient coils mounted along opposite sides of the dielectric former and 90° rotated from the two individual x-gradient coils, the individual y-gradient coils each including at least one current loop.

14. The magnetic resonance imaging apparatus as set forth in claim 13 wherein at least one of the individual y-gradient coil includes three current loops generally aligned along a common axis which is parallel to an axis of the dielectric former internal bore.

15. The magnetic resonance imaging apparatus as set forth in claim 13 wherein the pair of z-gradient coils includes two individual z-gradient coils disposed on opposite sides of the dielectric former and having a central axis which is substantially aligned with the common axis of the individual y-gradient coil loops.

16. The magnetic resonance imaging apparatus as set forth in claim 10 further including an insertable radio frequency coil mounted within the cylindrical dielectric former and a radio frequency shield disposed between the insertable radio frequency coil and the x, y, and z-gradient coil pairs.

17. A magnetic resonance imaging method comprising:

generating a temporally constant magnetic field along a magnetic field axis through an imaging region;

transmitting radio frequency signals into the imaging region to induce and manipulate magnetic resonance of selected dipoles in the imaging region;

receiving magnetic resonance signals emanating from the selected dipoles in the imaging region and reconstructing an image representation from the magnetic resonance signals; and, receiving a portion of a subject along a subject receiving axis of a magnetic field gradient coil assembly;

disposing the subject and the magnetic field gradient coil assembly in the imaging region with the subject receiving axis out of alignment with the magnetic field axis;

with the magnetic field gradient coil assembly, generating magnetic field gradients along three orthogonal axes across the portion of the subject receiving in the magnetic field gradient coil assembly.

* * * * *